(12) United States Patent
Flachowsky et al.

(10) Patent No.: US 8,809,151 B2
(45) Date of Patent: Aug. 19, 2014

(54) TRANSISTOR COMPRISING AN EMBEDDED SIGMA SHAPED SEQUENTIALLY FORMED SEMICONDUCTOR ALLOY

(75) Inventors: Stefan Flachowsky, Dresden (DE); Stephan-Detlef Kronholz, Dresden (DE); Jan Hoentschel, Dresden (DE); Thilo Scheiper, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 336 days.

(21) Appl. No.: 13/232,571

(22) Filed: Sep. 14, 2011

(65) Prior Publication Data
US 2012/0161204 A1 Jun. 28, 2012

(30) Foreign Application Priority Data

Dec. 28, 2010 (DE) .......... 10 2010 064 282

(51) Int. Cl.
*H01L 21/336* (2006.01)
*H01L 29/78* (2006.01)
*H01L 29/66* (2006.01)
*H01L 29/165* (2006.01)

(52) U.S. Cl.
CPC .......... *H01L 29/165* (2013.01); *H01L 29/7848* (2013.01); *H01L 29/6659* (2013.01); *H01L 29/66636* (2013.01); *H01L 29/7834* (2013.01)
USPC ............ 438/286; 438/222; 438/226; 438/429

(58) Field of Classification Search
USPC .................. 438/286, 222, 226, 429
See application file for complete search history.

(56) References Cited

U.S. PATENT DOCUMENTS

| | | | |
|---|---|---|---|
| 8,183,100 B2 * | 5/2012 | Mulfinger et al. ............ 438/154 |
| 2002/0193818 A1 * | 12/2002 | Sparks .......................... 606/185 |
| 2009/0020783 A1 * | 1/2009 | Zhang et al. .................. 257/190 |
| 2009/0261349 A1 | 10/2009 | Lee et al. | |

OTHER PUBLICATIONS

Translation of Official Communication from German Patent Application No. 10 2010 064 282.7 dated Jul. 12, 2011.

* cited by examiner

*Primary Examiner* — Thien F Tran
(74) *Attorney, Agent, or Firm* — Amerson Law Firm, PLLC (57) ABSTRACT

In sophisticated transistors, a specifically designed semiconductor material, such as a strain-inducing semiconductor material, may be sequentially provided in the drain region and the source region, thereby enabling a significant degree of lateral extension of the grown semiconductor materials without jeopardizing mechanical integrity of the transistor during the processing thereof. For example, semiconductor devices having different drain and source sides may be provided on the basis of sequentially provided embedded semiconductor materials.

17 Claims, 3 Drawing Sheets

TRANSISTOR COMPRISING AN EMBEDDED SIGMA SHAPED SEQUENTIALLY FORMED SEMICONDUCTOR ALLOY

BACKGROUND OF THE INVENTION

1. Field of the Invention

Generally, the present disclosure relates to the fabrication of integrated circuits, and, more particularly, to transistors having strained channel regions by using embedded semiconductor alloys, such as silicon/germanium, to enhance charge carrier mobility in the channel regions of the transistors.

2. Description of the Related Art

The fabrication of complex integrated circuits requires the provision of a large number of transistor elements, which represent the dominant circuit element for complex circuits. For example, several hundred millions of transistors may be provided in presently available complex integrated circuits. Generally, a plurality of process technologies are currently practiced, wherein, for complex circuitry, such as microprocessors, storage chips and the like, MOS technology is the most promising approach due to the superior characteristics in view of operating speed and/or power consumption and/or cost efficiency. In MOS circuits, field effect transistors, i.e., P-channel transistors and/or N-channel transistors, are used for forming circuit elements, such as inverters and other logic gates to design highly complex circuit assemblies, such as CPUs, storage chips and the like. During the fabrication of complex integrated circuits using MOS technology, transistors are formed on a substrate including a crystalline semiconductor layer. A MOS transistor or generally a field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on the dopant concentration, the mobility of the charge carriers, and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions so as to provide low sheet and contact resistivity in combination with desired channel controllability. Moreover, the gate dielectric material may also be adapted to the reduced channel length in order to maintain the required channel controllability. However, some mechanisms for maintaining high channel controllability may also have a negative influence on the charge carrier mobility in the channel region of the transistor, thereby partially offsetting the advantages gained by the reduction of the channel length.

Since the continuous size reduction of the critical dimensions, i.e., the gate length of the transistors, necessitates the adaptation and possibly the new development of highly complex process techniques and may also contribute to less pronounced performance gain due to mobility degradation, it has been proposed to enhance the channel conductivity of the transistor elements by increasing the charge carrier mobility in the channel region for a given channel length, thereby enabling a performance improvement that is comparable with the advance to a technology standard requiring extremely scaled critical dimensions, while avoiding or at least postponing many of the process adaptations associated with device scaling.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which in turn may directly translate into a corresponding increase in conductivity. On the other hand, compressive strain in the channel region may increase the mobility of holes, thereby providing the potential for enhancing the performance of P-type transistors. The introduction of stress or strain engineering into integrated circuit fabrication is an extremely promising approach, since strained silicon may be considered as a new type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium (Si/Ge) material next to the channel region so as to induce a compressive stress that may result in a corresponding strain. When forming the Si/Ge material, the drain and source regions of the PMOS transistors are selectively recessed to form cavities, while the NMOS transistors are masked, and subsequently the silicon/germanium material is selectively formed in the cavities of the PMOS transistor by epitaxial growth.

Although this technique provides significant advantages in view of performance gain of P-channel transistors and thus of the entire CMOS device, it turns out that, upon further device scaling, the efficiency of this strain-inducing mechanism strongly depends on the strain level in the semiconductor alloy and, in particular, from the lateral offset of the strain-inducing material from the channel region. That is, the strain-inducing effect is based on the fact that a semiconductor alloy has a different natural lattice constant compared to the silicon base material, such that the strain-inducing semiconductor alloy, such as the silicon/germanium material, is grown in a strained state, which in turn induces the desired strain in the laterally adjacent channel region. The magnitude of the strain thus depends on the amount of the lattice mismatch between the natural lattice constants of silicon and the semiconductor alloy. Consequently, increasing the fraction of the atomic species having a different covalent radius compared to the silicon species may thus result in an increased strained state. It turns out, however, that, for presently-available selective epitaxial growth techniques for silicon/germanium material, the maximum germanium concentration may be limited at approximately 80 atomic percent, unless severe lattice defect may be created during the selective epitaxial growth process.

Moreover, the amount of the strain-inducing semiconductor material, and in particular its lateral offset, which may be considered as the lateral offset with respect to an electrode material of the gate electrode structure, may thus also significantly influence the finally-obtained strain level in the underlying channel region.

Due to the above-specified restrictions of currently available deposition recipes, as discussed above, great efforts are being made in reducing the lateral offset of the strain-inducing semiconductor material and also increasing the amount of material positioned in the drain and source areas of the transistor. Basically, the amount of strain-inducing semiconductor material may be increased, for instance, increasing the size and appropriately selecting the shape of the corresponding cavities that are formed laterally offset from the gate electrode structure. To this end, sophisticated etch strategies are applied, wherein the etch depth may substantially determine the size and thus the amount of semiconductor material that may be formed therein. To this end, corresponding anisotropic plasma-based etch processes are applied, wherein, however, the lateral offset may basically be determined by the width of any protecting spacer or liner materials formed on the sidewalls of the gate electrode structure in order to maintain integrity of sensitive gate materials. Although generally an offset of zero may be established by providing extremely thin protective liner materials, any such process recipes may result in significant variability of transistor characteristics, since extremely thin protective materials may have to be deposited, wherein any fluctuations in the process strategies involved may thus contribute to increased variations of the lateral distance, since, in particular, also any variations of the plasma-based etch process may additionally significantly contribute to corresponding variations of the resulting cavities.

Consequently, in other approaches, it has been proposed to provide a certain degree of under-etching, for instance by implementing an isotropic etch phase, which may thus provide a lateral etch rate, thereby obtaining a negative offset of the resulting cavities. In order to reduce any process-related variations of the under-etched cavities, frequently crystallographically anisotropic etch recipes are applied, in which the etch rate in one crystallographic plane is significantly less than in other crystallographic planes, so that the lattice planes of reduced etch rate may act as efficient etch stop planes. For example, for silicon material, a plurality of wet chemical etch recipes are well established in which the (111) planes may act as efficient etch stop planes, thereby enabling a well-controlled etch process, in particular in the lateral direction, which thus has a self-limiting behavior, thereby resulting in superior process control with respect to size and shape of the cavities. Consequently, the strain-inducing semiconductor alloy, such as the silicon/germanium alloy, may be filled in to the previously formed cavities of well-defined shape and size, thereby obtaining a high strain transfer into the channel region while reducing any process-related fluctuations, in particular any fluctuations of the etch process.

Consequently, according to these process strategies, a pronounced degree of under-etching may be accomplished in a well-controllable manner by using crystallographically anisotropic etch techniques, which may thus enable a significant increase of the finally-obtained strain in the channel region. Thus, in some approaches, the degree of under-etching of the gate electrode structure upon forming the cavities in the active region of, for instance, P-channel transistors, has been increased in an attempt to further enhance transistor performance. It turns out, however, that upon further increasing the extension of the cavities below the gate electrode structure, a significant mechanical instability is introduced, which may result in severe transistor deterioration or even in a complete transistor failure upon forming the strain-inducing semiconductor alloy and completing the basic transistor configuration by forming drain and source regions.

In view of the situation described above, the present disclosure relates to techniques and semiconductor devices in which, generally, transistor characteristics may be adjusted on the basis of epitaxially-grown semiconductor materials, which may be provided with a reduced offset or a negative off-set with respect to the gate electrode material, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which transistor characteristics, such as the strain conditions, the doping profile, band gap characteristics and the like, may be appropriately adjusted on the basis of epitaxially grown semiconductor material, which may be formed in corresponding cavities formed in the active region so as to significantly extend below the electrode material of the gate electrode structure. To this end, at least those parts of the cavities that extend below the gate electrode structure may be formed in a sequential manner with an intermediate deposition of one type of semiconductor material in order to provide superior mechanical stability of the transistor during the entire process sequence. In this manner, the degree of under-etching upon forming one cavity may be adjusted in accordance with device requirements without being restricted by any considerations with respect to the transistor stability. Thus, after depositing one type of semiconductor material in the corresponding cavity having the desired degree of lateral extension below the gate electrode structure, the mechanical integrity of the transistor is reestablished and thus enables the formation of a further cavity or at least a significant part thereof so as to extend below the gate electrode structure in a desired manner, wherein, in some illustrative embodiments, even a merged architecture with respect to the sequentially-grown semiconductor materials may be implemented.

One illustrative method disclosed herein comprises forming a first cavity in a crystalline semiconductor region in the presence of a gate electrode structure of a transistor, wherein the first cavity extends below the gate electrode structure. The method further comprises forming a first semiconductor material in the first cavity. The method additionally comprises forming at least a portion of a second cavity in the crystalline semiconductor region in the presence of the gate electrode structure and in the presence of the first semiconductor material, wherein the second cavity extends below the gate electrode structure. Moreover, the method comprises forming a second semiconductor material in the second cavity and forming drain and source regions in the semiconductor region.

A further illustrative method disclosed herein relates to forming an embedded strain-inducing semiconductor alloy in a transistor. The method comprises forming a first cavity in a first portion of an active region of the transistor, wherein a part of the first cavity extends below an electrode material of a gate electrode structure that is formed above the active region. The method further comprises epitaxially growing a first portion of the strain-inducing semiconductor alloy in the first cavity. Moreover, the method comprises forming a second cavity in a second portion of the active region, wherein a part of the second cavity extends below the electrode material. Moreover, a second portion of the strain-inducing semiconductor alloy is formed in the second cavity in the presence of the first portion of the strain-inducing semiconductor alloy.

One illustrative field effect transistor disclosed herein comprises a gate electrode structure formed above a crystalline semiconductor region, wherein the gate electrode structure comprises a gate dielectric layer that separates an electrode material from the crystalline semiconductor region. Moreover, the field effect transistor comprises a first semiconductor alloy formed in the crystalline semiconductor region at a first side of the transistor and below the gate dielectric layer. Additionally, a second semiconductor alloy is formed in the crystalline semiconductor region at a second side of the transistor and below the gate dielectric layer, wherein the first and second semiconductor alloys differ from each other in at least one of size, shape and material composition. Moreover, the field effect transistor comprises drain and source regions formed in the crystalline semiconductor region and at least in a portion of the strain-inducing semiconductor alloy.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which at least portions of corresponding cavities in the active region of a field effect transistor may be provided in a sequential manner in order to preserve the mechanical stability of the transistor upon incorporating a desired type of semiconductor material into the active region. To this end, a respective side of the transistor may be masked on the basis of any appropriate material and a cavity, or at least a portion thereof, which extends below the gate electrode structure to a desired extent, may be formed on the basis of any appropriate etch technique, which may comprise a crystallographically anisotropic etch step, while the other transistor side is covered by the etch mask. Thereafter, a semiconductor material may be grown by an epitaxial growth process so as to implement the desired transistor characteristics. In some illustrative embodiments, the semiconductor material may be provided in the form of a strain-inducing material, such as a silicon/germanium material, a silicon/germanium/tin material, a silicon/tin material, in order to create a high compressive strain in a silicon base material, while, in other illustrative embodiments, other semiconductor materials, such as silicon/carbon, may be incorporated in order to provide a tensile strain component. In addition to or alternatively to providing a strain-inducing semiconductor material in the previously-formed cavity, the semiconductor material may be appropriately provided so as to adjust other characteristics, such as doping profile and the like, as desired. Thereafter, a second cavity or at least a portion thereof that extends below the gate electrode structure may be formed in the presence of the previously-grown semiconductor material in combination with an appropriate etch mask, wherein the size and shape of the second cavity may be adjusted on the basis of specific transistor requirements, wherein substantially the same size and shape as in the previously-formed cavity may be selected, while, in other cases, an individual adjustment of both transistor sides may be accomplished. Similarly, a further semiconductor material, such as a strain-inducing semiconductor material, an appropriately in situ doped semiconductor material and the like, may be formed by epitaxial growth techniques so as to fill the previously-formed cavity.

Consequently, by sequentially providing the semiconductor materials for the different transistor sides, a high degree of flexibility in adjusting the transistor characteristics may be achieved, since the processes for forming the cavities and/or the processes for providing the semiconductor material may be performed on the same or different process parameters so as to individually adjust the corresponding transistor characteristics. For example, any asymmetric configuration may be readily implemented by appropriately dimensioning the corresponding cavities and/or by using different material characteristics upon providing the semiconductor material. Consequently, different strain conditions, different electronic characteristics, such as different doping and the like, may be readily adjusted in sophisticated field effect transistors.

Figure 1A:
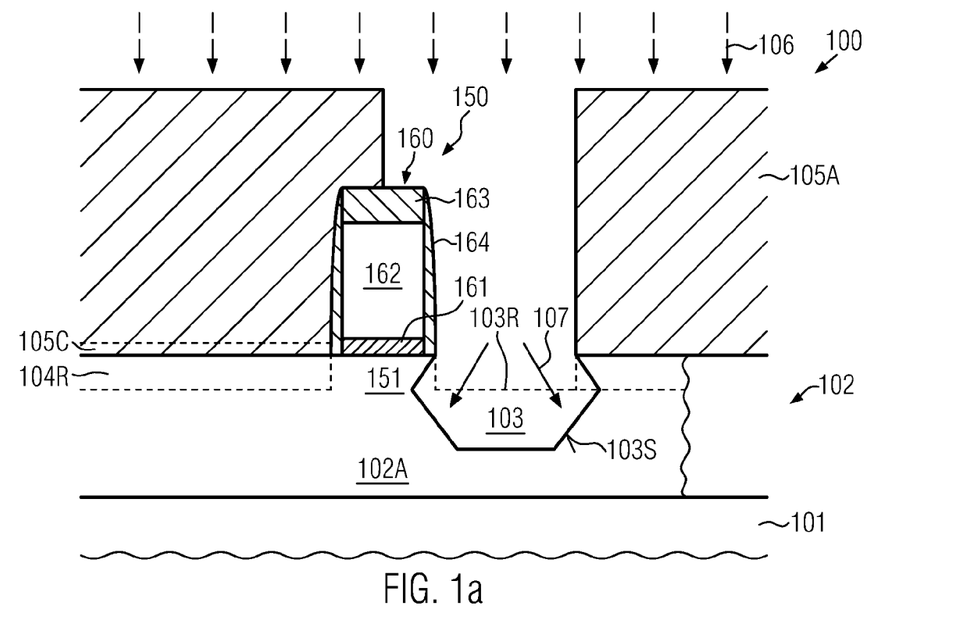
FIG. 1a schematically illustrates a cross-sectional view of a semiconductor device in a manufacturing stage in which a cavity is selectively formed in one side of a transistor so as to adjust a desired degree of under-etching, according to illustrative embodiments.

FIG. 1a schematically illustrates a cross-sectional view of a semiconductor device 100, which may comprise a substrate 101 and a semiconductor layer 102. The substrate 101 and the semiconductor layer 102 may represent a bulk configuration, in which the semiconductor layer 102 may directly connect to a crystalline material of the substrate 101. In other cases (not shown), a silicon-on-insulator (SOI) configuration may be implemented, if considered appropriate, in which a buried insulating material (not shown) may be positioned below the semiconductor layer 102. As discussed above, the semiconductor layer 102 may represent a silicon base material, the electrode characteristics may be locally enhanced by incorporating an appropriate semiconductor material, such as a strain-inducing semiconductor material. The semiconductor layer 102 is typically divided into a plurality of semiconductor regions or active regions, for instance by means of corresponding isolation structures (not shown), wherein, for convenience, a single active region or semiconductor region 102A is illustrated in FIG. 1a. Generally, an active region is to be understood as a semiconductor region in and above which one or more transistors are to be formed. In the embodiment shown, a gate electrode structure 160 of a transistor 150 is formed on the active region 102A and may have any appropriate configuration. For example, in a planar transistor configuration, the gate electrode structure 160 may comprise a gate dielectric material 161 and an electrode material 162, which may have any appropriate configuration in terms of material composition and the like. Moreover, typically, a dielectric cap material 163 may be provided, possibly in combination with any sidewall spacer or liner 164, if the integrity of the materials 161 and 162 has to be preserved. It should be appreciated that, in sophisticated applications, the liner material 164 may have a thickness of approximately 5 nm and significantly less. Moreover, it should be appreciated that, in sophisticated applications, a length of the gate electrode structure 160, i.e., in FIG. 1a, the horizontal extension of the electrode material 162, may be 50 nm and significantly less. Furthermore, in some embodiments, the gate electrode structure 160 may comprise a high-k dielectric material within the gate insulation layer 161, while also a metal-containing electrode material may be provided in the electrode material 162. In other cases, one or both of these sophisticated material systems may be provided in a very advanced manufacturing stage, if required. Moreover, a cavity 103 may be formed at one side of the transistor 150, while a portion of the gate electrode structure 160 and the other side of the transistor 150 may be covered by an etch mask 105A. The etch mask 105A may be provided in the form of any appropriate material, such as silicon dioxide, silicon nitride, amorphous carbon and the like. In some illustrative embodiments, the etch mask 105A may comprise an etch stop material 105C, which may provide superior control upon removing the mask 105A in a later manufacturing stage. For example, the etch stop liner 105C, if provided, may represent a material that may have been deposited in order to provide the protective liner 164. In other cases, a dedicated etch stop material, such as silicon dioxide, silicon nitride and the like, may be deposited prior to the deposition of the remaining mask material of the mask 105A, wherein, in any such case, the etch stop material may still be present on the mask portion of the gate electrode 160 (not shown).

The semiconductor device 100 as shown in FIG. 1a may be formed on the basis of the following processes. After incorporating corresponding isolation structures (not shown), thereby laterally delineating the active region 102A, the gate electrode structure 160 may be formed on the basis of any appropriate process strategy. That is, after incorporating the basic dopant species into the active region 102A, appropriate material or material systems may be formed, for instance, by oxidation, deposition and the like, followed by a sophisticated patterning sequence for patterning the resulting layer stack so as to obtain the desired lateral size of the electrode material 162 and the gate insulating material 161. Moreover, the dielectric cap layer 163, if required, may also be patterned along with the electrode material 162 and may be used as an efficient hard mask material during the complex patterning sequence. Next, the liner material 164, possibly in combination with the etch stop liner 105C, if required, may be formed by any appropriate deposition process, while, in other cases, the protective liner or spacer 164 may be formed by oxidation and the like. Next, an appropriate material may be deposited in order to form the mask 105A, which may be accomplished by the deposition of silicon dioxide and the like, for instance based on well-established deposition techniques, such as high density plasma chemical vapor deposition (CVD), sub-atmospheric CVD and the like. If required, a planarization may be performed so as to provide superior surface conditions when performing a corresponding lithography process. In other cases, the etch mask 105A may be provided in the form of a resist material and the like, which may be used to pattern a moderately thin hard mask material, such as the liner 105C, thereby finally exposing the active region 102A. Thereafter, in some illustrative embodiments, an etch process 106 may be performed on the basis of well-established anisotropic plasma-based etch recipes in order to form a recess 103R, as indicated, wherein a depth of the recess 103R may be adjusted on the basis of the etch time for given parameters of the etch process 106.

In some illustrative embodiments, as indicated by 104R, a corresponding recess may also be formed in the other side of the active region 102A, which may be accomplished by performing the etch process 106 prior to providing the etch mask 105A. In this case, the recesses 103R, 104R may be formed in a common etch process. It should be appreciated that, in this case, the mask 105A may thus also fill the recess 104R prior to the patterning of the mask 105A. Thereafter, a further etch process 107 may be performed, which may provide a certain degree of under-etching in order to adjust the finally-obtained size and shape of the cavity 103. In some illustrative embodiments, the etch process 107 may comprise a crystallographically anisotropic etch process, for instance using TMAH (tetra methyl ammonium hydroxide), or any other wet chemical recipe, which may provide superior etch stop capabilities in some crystallographic planes, such as a (111) plane or any physically equivalent plane, as is also discussed above. For example, for a given crystallographic configuration of the active region 102A, for instance a configuration in which the surface of the semiconductor layer 102 may correspond to a (100) or a physically equivalent plane, based on the previously-formed recess 103R, respectively inclined sidewall surface areas 103S may be obtained, which represent (111) planes having a predefined inclination angle. Consequently, as is also discussed above, based on the recess 103R, a well-defined degree of under-etching of the gate electrode structure 160 may be accomplished. Thus, the cavity 103 forms an inclined interface with a channel region 151 in a highly-controllable manner.

Figure 1B:
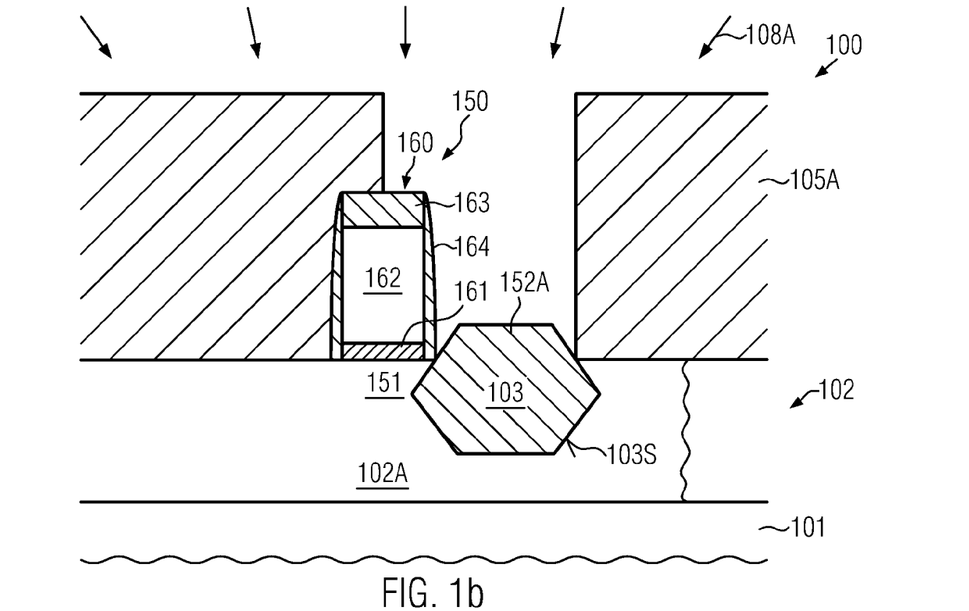
FIG. 1b schematically illustrates the semiconductor device during a selective epitaxial growth process for filling the previously formed cavity with an appropriate semiconductor material, according to illustrative embodiments.

FIG. 1b schematically illustrates the semiconductor device 100 in a further advanced manufacturing stage. As illustrated, a device may be exposed to a selective deposition atmosphere of an epitaxial growth process 108A in order to form a semiconductor material 152A in the cavity 103. In the embodiment shown, the mask 105A may also be used as a deposition mask, while, in other illustrative embodiments (not shown), the mask 105A may be removed and an appropriate hard mask material, such as the layer 105C of FIG. 1a, may be used as a growth mask. It should be appreciated that, during the selective deposition process 108A, the process parameters may be adjusted such that the semiconductor material 152A may receive the desired material characteristics. For example, in some illustrative embodiments, the material 152A may be provided in a highly-strained state by depositing at least a portion of the material 152A in the form of a strain-inducing semiconductor material, such as silicon in combination with at least one of germanium, tin and the like, while, in other cases, silicon/carbon may be deposited, depending on the type of strain required for enhancing performance of the transistor 150. For example, during the deposition process 108A, a constant or varying concentration of an atomic species of greater or smaller covalent radius compared to silicon may be incorporated, depending on the type of strain required. Moreover, the concentration may be varied during the deposition process 108A, for instance when different material characteristics may be required. For example, at an upper portion of the material 152A, an increased amount of silicon may be provided in order to enhance the further processing, if considered appropriate. Similarly, in addition to or alternatively to providing a strain-inducing atomic species in the material 152A, a dopant species may be incorporated with a desired concentration, thereby obtaining a precisely incorporated dopant in the material 152A, which, in combination with the previously defined shape of the cavity 103, may also result in a well-defined dopant profile. For example, drain and source dopant species, counter-doping species as used for any halo regions and the like may be incorporated during the process 108A. Thereafter, the processing may be continued by removing the mask 105A.

Figure 1C:
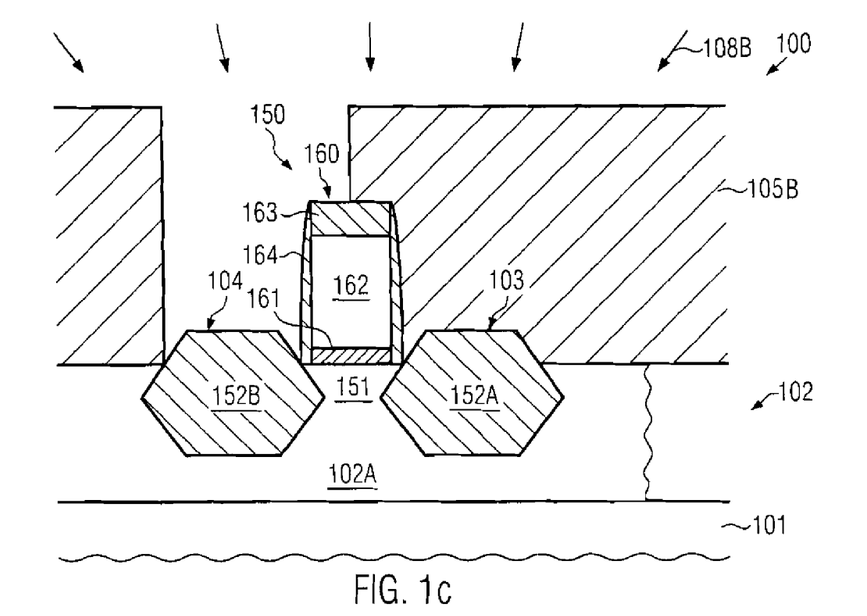
FIG. 1c schematically illustrates the semiconductor device in a further advanced manufacturing stage in which a second semiconductor material may be selectively formed in the other side of the transistor by using an appropriately shaped cavity, according to illustrative embodiments.

FIG. 1c schematically illustrates the semiconductor device 100 in a further advanced manufacturing stage. As illustrated, a second mask 105B may be provided so as to expose a portion of the gate electrode structure 160 and the other side of the transistor 150, i.e., the side opposite to the side in which a cavity 103 has been formed during the previous processing. It should be appreciated that opposite is to be understood with respect to a transistor length direction, which is the horizontal extension in FIG. 1c. In the manufacturing stage shown, the device 100 is exposed to a further deposition ambient 108B in order to form a second semiconductor material 152B in a cavity 104. To this end, a similar process sequence may be applied, as previously discussed with reference to FIG. 1a, in order to appropriately determine the size and shape of the cavity 104. To this end, a corresponding anisotropic plasma-assisted etch process, such as the process 106 as described above with reference to FIG. 1a may be applied, while, in other cases, a certain degree of recessing may have been implemented during an earlier manufacturing phase, as is also discussed above. Thereafter, a further wet chemical etch process, such as the process 107 of FIG. 1a, may be applied in order to determine the final size and shape of the cavity 104. It should be appreciated that the size and shape of the cavity 104 may differ from the size and shape of the cavity 103, if considered appropriate for adjusting the overall transistor characteristics. In other cases, substantially the same size and shape may be provided for the cavities 103, 104. It should be appreciated that, for providing an appropriate etch mask and deposition mask, such as the mask 105B, the same criteria may apply as previously discussed with reference to FIGS. 1a and 1b. Next, the selective deposition process 108B may be performed on the basis of appropriately selected process parameters in order to adjust the material characteristics of the material 152B. For example, the material 152B may be provided in the form of a strain-inducing semiconductor material, possibly in combination with an in situ dopant species, wherein the material composition and/or the dopant concentration may vary along the depth of the cavity 104, if considered appropriate, which may be accomplished by appropriately controlling the process parameters, such as gas flow rates and the like. In some illustrative embodiments, the semiconductor materials 152A, 152B may both be provided in the form of a strain-inducing semiconductor material having substantially the same material composition. In other cases, however, the materials 152A, 152B may differ in their material composition, for instance, when different electronic characteristics, such as band gap energy and the like, may have to be implemented differently for a drain side and a source side of the transistor 150. Similarly, the corresponding dopant species may be the same or may be different in the materials 152A, 152B, when provided in the form of an in situ doped material.

Consequently, upon forming at least a part of the cavities 103, 104 in a sequential manner and thus also forming the materials 152A, 152B sequentially, by means of the growth processes 108A, 108B (FIG. 1b, FIG. 1c), a high degree of flexibility is achieved in order to adjust the overall characteristics of the transistor 150. At the same time, the mechanical stability of the transistor 150 may not be at risk, even if one or both of the cavities 103, 104 extend far below the gate electrode structure 160.

Figure 1D:
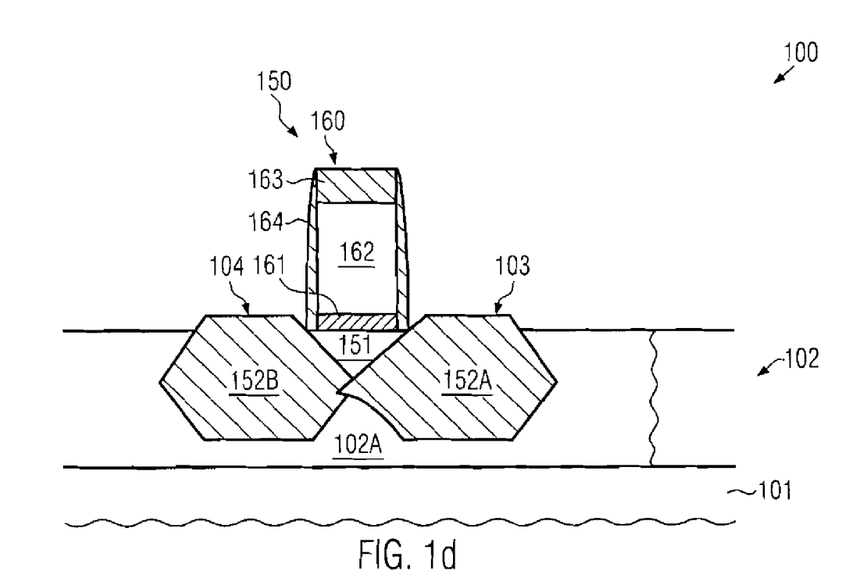
FIG. 1d schematically illustrates a transistor architecture in which a merged configuration may be established by applying a process sequence as described above with reference to FIGS. 1a-1c.

FIG. 1d schematically illustrates the semiconductor device 100 according to further illustrative embodiments in which the semiconductor materials 152A, 152B may be provided such that these materials may merge below the gate electrode structure 160. This may be accomplished by forming one of the cavities 103, 104 so as to extend below the gate electrode structure 160 with a sufficient lateral extension that enables an exposure of a portion of the material 152A or 152B during the formation of the other one of the cavities 103, 104. For example, a process sequence may be applied, as discussed above with reference to FIGS. 1a and 1b, in which the cavity for accommodating the semiconductor material 152A may be formed so as to extend laterally below the gate electrode structure 160 beyond the center of the gate electrode structure 160, which may be accomplished by appropriately selecting an initial depth of the recess 103R (FIG. 1a) as is also discussed above. Hence, after filling in the material 152A, the cavity 104 may be provided so as to connect to the material 152A. It should be appreciated, however, that the cavity 103 may be formed with reduced lateral extension, while, on the other hand, the cavity 104 may then be etched so as to connect to the material 152A. Consequently, when providing the materials 152A, 152B with a high internal strained state, the resulting channel region 151 formed of the initial silicon base material may receive a high strain component, thereby even further enhancing the charge carrier mobility therein. It should be appreciated, however, that the materials 152A, 152B may be provided with different material characteristics, as may be required for the overall transistor performance. For example, different material composition, different in situ doping and the like may be implemented, when a basically asymmetric transistor configuration is considered appropriate.

Figure 1E:
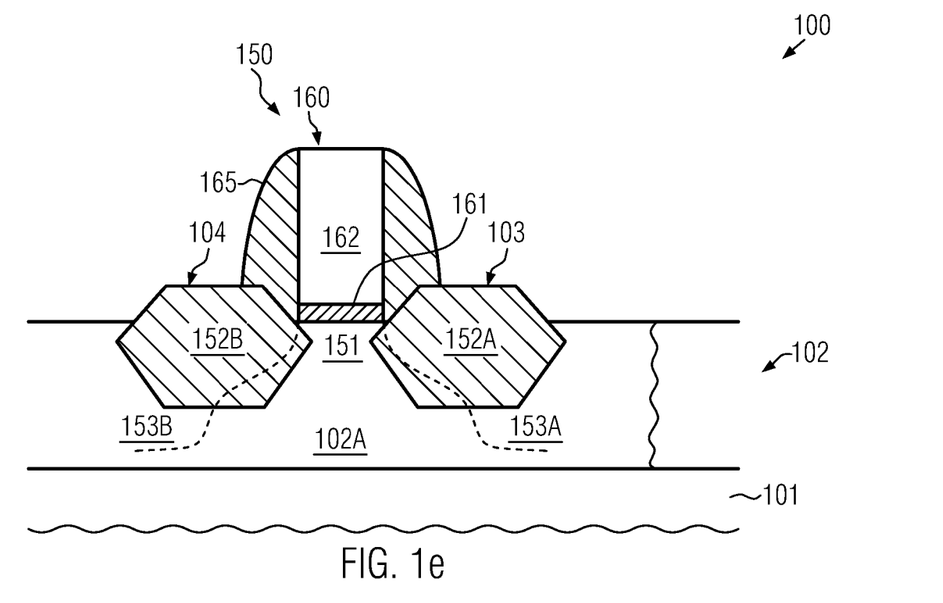
FIG. 1e schematically illustrates the field effect transistor in a further advanced manufacturing stage, when drain and source regions are provided in the active region, according to illustrative embodiments.

FIG. 1e schematically illustrates the device 100 in a further advanced manufacturing stage. As shown, drain or source regions 153A, 153B are formed within the active region 102A and may thus be formed at least in a portion of the semiconductor materials 152A, 152B. For example, the drain and source regions 153A, 153B may be formed on the basis of implantation techniques, wherein an appropriate dopant profile may be incorporated, possibly in combination with a sidewall spacer structure 165, wherein a final dopant profile may be adjusted by performing appropriate anneal processes for activating the dopant species and re-crystallizing implantation-induced damage. In other illustrative embodiments, at least one of the drain and source regions 153A, 153B may be formed on the basis of dopant species incorporated during the growth of one or both of the materials 152A, 152B. In this case, the corresponding dopant concentration may be provided with a reduced degree of lattice damage and may thus allow reduced temperatures during any subsequent anneal processes and the like. It should be appreciated that, in some illustrative embodiments, the entire dopant profile of the regions 153A, 153B may be achieved on the basis of the materials 152A, 152B, which may be accomplished by appropriately shaping the cavities 103, 104 and providing the materials 152A, 152B in an appropriately in situ doped manner, as required for defining an appropriate lateral and vertical dopant profile. In this case, any high temperature processes may even be completely omitted, if considered appropriate.

As a result, the present disclosure provides semiconductor devices and manufacturing techniques in which transistor characteristics, such as strain conditions in a channel region, doping profile and the like, may be individually adjusted by forming at least a portion of cavities sequentially in order to maintain mechanical transistor stability during the further processing. Consequently, the size and shape of the cavities, as well as the material characteristics of the semiconductor material to be grown therein, may be individually adapted, which may thus provide superior performance of the transistors, while at the same time achieving superior overall process control.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first cavity in a crystalline semiconductor region in the presence of a gate electrode structure of a transistor, said first cavity extending under said gate electrode structure;
   forming a first semiconductor material in said first cavity;
   after forming the first semiconductor material in the first cavity, forming at least a portion of a second cavity in said crystalline semiconductor region in the presence of said gate electrode structure and of said first semiconductor material, said second cavity extending under said gate electrode structure;
   forming a second semiconductor material in said second cavity; and
   forming drain and source regions in said semiconductor region.

2. The method of claim 1, wherein forming said first cavity comprises forming a first mask that exposes a first portion of said semiconductor region corresponding to one of the drain and source regions and covers a second portion of said semiconductor region corresponding to the other of the drain and source regions and performing at least a wet chemical etch process that has a crystallographically anisotropic etch behavior in the presence of said first mask.

3. The method of claim 2, wherein forming said first cavity further comprises performing a plasma-based anisotropic etch process prior to performing said wet chemical etch process.

4. The method of claim 3, wherein said plasma-based etch process is performed after forming said first mask.

5. The method of claim 2, wherein forming said at least a portion of said second cavity comprises removing the first mask layer, forming a second mask that exposes the second portion of said semiconductor region and covers said first semiconductor material and performing at least a second wet chemical etch process that has a crystallographically anisotropic etch behavior in the presence of said second mask.

6. The method of claim 2, wherein said wet chemical etch process is performed on the basis of tetra methyl ammonium hydroxide (TMAH).

7. The method of claim 1, wherein said first and second cavities are formed so as to differ in at least one of size and shape.

8. The method of claim 1, wherein at least one of said first and second semiconductor materials is formed in a strained state.

9. The method of claim 8, wherein said first semiconductor material and said second semiconductor material are formed so as to induce the same type of strain in a channel region of said transistor.

10. The method of claim 1, wherein forming said first and second cavities comprises forming said first and second cavities so as to merge with one another below said gate electrode structure.

11. The method of claim 1, wherein at least one of said first and second semiconductor materials comprises at least one of germanium and tin.

12. The method of claim 1, wherein at least one of said first and second semiconductor materials comprises carbon.

13. A method of forming an embedded strain-inducing semiconductor alloy in a transistor, the method comprising:
   forming a first mask layer that exposes a first portion of an active region of a transistor and covers a second portion of the active region of the transistor;
   with the first mask in position, forming a first cavity in a first portion of the active region of said transistor, a part of said first cavity extending below an electrode material of a gate electrode structure formed above said active region;

epitaxially growing a first portion of said strain-inducing semiconductor alloy in said first cavity;

removing the first masking layer;

forming a second mask layer that exposes the second portion of the active region of the transistor and covers the first portion of the active region of the transistor;

with the second mask layer in position, forming a second cavity in the second portion of said active region, a part of said second cavity extending below said electrode material; and forming a second portion of said strain-inducing semiconductor alloy in said second cavity in the presence of said first portion of said strain-inducing semiconductor alloy.

14. The method of claim 13, wherein forming said first and second cavities comprises sequentially performing a first wet chemical etch process and a second wet chemical etch process that have a crystallographically anisotropic etch behavior.

15. The method of claim 14, wherein forming said first and second cavities comprises sequentially performing a first plasma-based anisotropic etch process and a second plasma-based anisotropic etch process.

16. The method of claim 13, wherein said first and second cavities are formed so as to differ in at least one of size and shape.

17. A method, comprising:

performing a plasma-etch process to form first and second initial recesses in a crystalline semiconductor region on opposite sides of a gate electrode structure of a transistor;

after performing the plasma-based etch process, forming a first mask so as to expose a first portion of said semiconductor region corresponding to one of a drain and source region and cover a second portion of said semiconductor region corresponding to the other of a drain and source region;

with the first mask in position, performing at least a wet chemical etch process that has a crystallographically anisotropic etch behavior in the presence of said first mask so as to form a first cavity in a crystalline semiconductor region in the presence of a gate electrode structure of a transistor, said first cavity extending below said gate electrode structure;

forming a first semiconductor material in said first cavity;

forming at least a portion of a second cavity in said crystalline semiconductor region in the presence of said gate electrode structure and of said first semiconductor material, said second cavity extending below said gate electrode structure;

forming a second semiconductor material in said second cavity; and forming drain and source regions in said semiconductor region.

* * * * *